United States Patent
Nagahata et al.

(10) Patent No.: US 6,849,154 B2
(45) Date of Patent: Feb. 1, 2005

(54) PLASMA ETCHING APPARATUS (75) Inventors: Kazunori Nagahata, Nakakoma-gun (JP); Eiji Hirose, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 172 days.

(21) Appl. No.: 10/361,772

(22) Filed: Feb. 11, 2003

(65) Prior Publication Data

US 2003/0111180 A1 Jun. 19, 2003

Related U.S. Application Data (60) Division of application No. 09/697,083, filed on Oct. 27, 2000, now abandoned, which is a continuation-in-part of application No. PCT/JP99/06619, filed on Nov. 26, 1999.

(30) Foreign Application Priority Data

Nov. 27, 1998 (JP) .......................................... 10-336886
Oct. 29, 1999 (JP) .......................................... 11-308765

(51) Int. Cl.[7] .............................................. H01L 21/00
(52) U.S. Cl. ................................................. 156/345.47
(58) Field of Search ................. 118/723 E; 156/345.43, 156/345.44, 345.46, 345.47; 315/111.21

(56) References Cited

U.S. PATENT DOCUMENTS

| | | | | |
|---|---|---|---|---|
| 4,539,068 A | * | 9/1985 | Takagi et al. | ............... 427/570 |
| 4,579,618 A | * | 4/1986 | Celestino et al. | ...... 156/345.44 |
| 5,314,603 A | * | 5/1994 | Sugiyama et al. | ..... 204/298.32 |
| 5,500,256 A | * | 3/1996 | Watabe | ........................ 427/579 |
| 5,716,534 A | | 2/1998 | Tsuchiya et al. | |
| 6,089,181 A | | 7/2000 | Suemasa et al. | |

FOREIGN PATENT DOCUMENTS

| | | | | |
|---|---|---|---|---|
| JP | 7-302786 | | 11/1995 | |
| JP | 8-31596 | | 2/1996 | |
| JP | 8-31807 | | 2/1996 | |
| JP | 08264515 A | * | 10/1996 | ....... H01L/21/3065 |
| JP | 10041281 A | * | 2/1998 | ....... H01L/21/3065 |

OTHER PUBLICATIONS

Translation of International Preliminary Examination Report.

* cited by examiner

Primary Examiner—Gregory Mills
Assistant Examiner—Michelle Crowell
(74) Attorney, Agent, or Firm—Oblon, Spivak, McClelland, Maier & Neustadt, P.C.

(57) ABSTRACT

A plasma etching apparatus includes an upper electrode and a lower electrode (susceptor) on which a semiconductor wafer is disposed, the upper and lower electrodes being arranged within a process chamber, a first high frequency power source for applying a first high frequency power to the upper electrode, a second high frequency power source for applying a second high frequency power having a frequency lower than the frequency of the first high frequency power to the lower electrode. A third high frequency power source for superposing a third high frequency power having a frequency lower than that of the first high frequency power and higher than that of the second high frequency power on the first high frequency power. A phase controller for adjusting the phase difference between the second high frequency power and the third high frequency power.

4 Claims, 7 Drawing Sheets

PLASMA ETCHING APPARATUS

CROSS-REFERENCE TO RELATED APPLICATIONS

This is a divisional of U.S. Application Ser. No. 09/697,083, filed on Oct. 27, 2000 now abandoned which is a Continuation-in-Part of Application Number PCT/JP99/06619, filed Nov. 26, 1999.

This application is based upon and claims the benefit of priority from the prior Japanese Patent Applications No. 10-336886, filed Nov. 27, 1998; and No. 11-308765, filed Oct. 29, 1999, the entire contents of which are incorporated herein by reference.

BACKGROUND OF THE INVENTION

The present invention relates to a plasma etching apparatus and method for applying a plasma processing to a substrate such as a semiconductor wafer.

In the manufacturing process of a semiconductor device, widely employed is a plasma etching treatment in which a plasma etching is applied to a target object or a semiconductor wafer (including a semiconductor wafer itself and a semiconductor wafer having a single film or a plurality of films formed thereon). Various types of plasma etching apparatuses are employed for the plasma etching treatment. Particularly, a capacitance coupling type parallel plate plasma processing apparatus is mainly used as the plasma etching apparatus.

In the capacitance coupling type parallel plate plasma etching apparatus, a pair of parallel plate electrodes (upper and lower electrodes) are arranged within a chamber a predetermined distance apart from each other to face each other. An etching gas is introduced into the chamber and, at the same time, a high frequency power is applied to one of the electrodes to form a high frequency electric field between the two electrodes. A plasma of the etching gas is formed by the high frequency electric field so as to apply a plasma etching to the semiconductor wafer.

Where a film formed on the semiconductor wafer, e.g., an oxide film, is etched by using the capacitance coupling type parallel plate plasma etching apparatus of the construction described above, a plasma of an intermediate density is formed by setting up an intermediate pressure within the chamber so as to make it possible to perform the optimum radical control. As a result, a suitable plasma state can be obtained so as to achieve an etching with a high selectivity ratio, with a high stability and with a high reproducibility.

To be more specific, it is described in "1997 DRY PROCESS SYMPOSIUM P385–390" that a high frequency of 27.12 MHz for plasma formation is applied to the upper electrode so as to form a plasma, and a high frequency of 800 kHz is applied to the lower electrode so as to draw the ions generated by the plasma onto the lower electrode, making it possible to perform a satisfactory etching under the pressure of 20 to 100 mTorr.

However, miniaturization of the design rule in USLI further proceeds in recent years, leading to demands for a higher aspect ratio in the shape of the hole. Under the conventional conditions, it is difficult to meet the requirement sufficiently.

Figure 8:
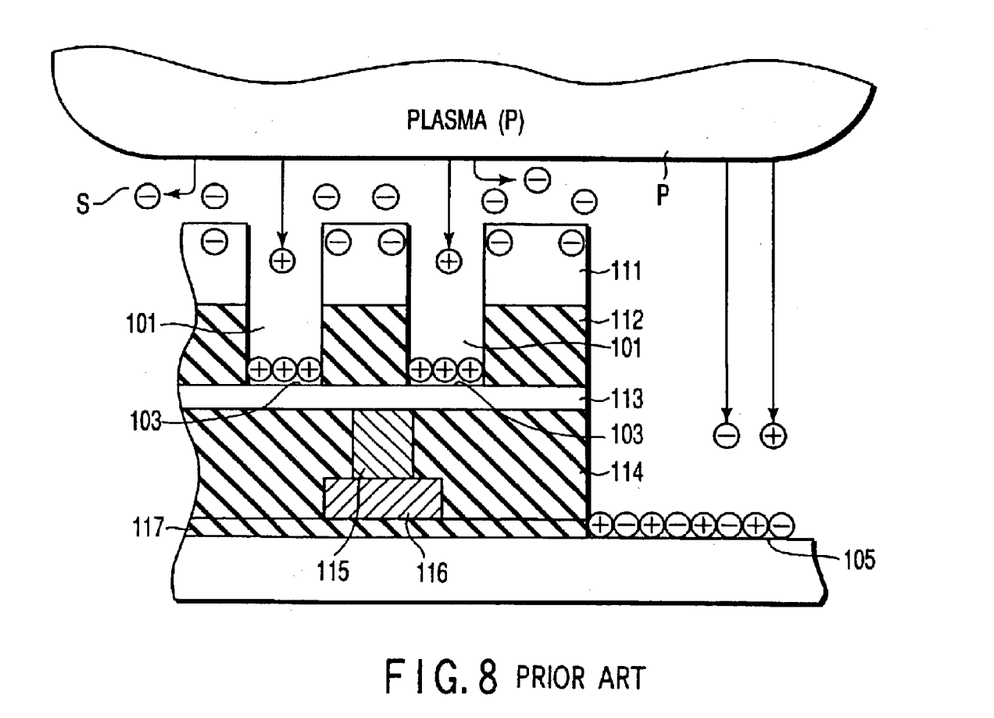
FIG. 8 is a view showing the concept of a shading damage in the conventional apparatus.

The conventional plasma etching, in which a semiconductor wafer is disposed on the lower electrode, will now be described with reference to FIG. 8. A reference numeral 111 shown in the figure represents a resist layer acting as a mask for the selective etching. Reference numerals 112, 114 and 117 represent insulating films ($SiO_2$ films), respectively. Further, reference numerals 113 and 115 represent an aluminum wiring and a gate wiring, respectively.

As shown in the figure, that portion of the resist layer 111 which is in the vicinity of a plasma sheath S is charged negative in the etching step, with the result that the electrons supplied from a plasma P are mainly moved in the lateral direction, resulting in failure to enter a contact hole 101 having a large aspect ratio. On the other hand, cations are accelerated by the plasma sheath so as to reach the bottom of the contact hole. As a result, the bottom portion (exposed portion of the aluminum wiring) 103 of the contact hole 101 is charged positive. On the other hand, both electrons and cations are accelerated to arrive at the space portion (exposed portion of the semiconductor wafer) 105 in which the contact hole is not formed without difficulty. As a result, a strong electric field is applied to the thin insulating film 117 positioned below the gate electrode 116 so as to bring about an insulation breakdown called shading damage.

DISCLOSURE OF INVENTION

An object of the present invention is to provide a plasma etching apparatus and method, which permit obtaining a suitable plasma state, which is capable of coping with the miniaturization of the etching pattern, and which does not bring about a shading damage.

As a result of an extensive research on a plasma etching capable of coping with the required miniaturization, the present inventors have found that a plasma can be formed with a lower pressure condition by increasing the frequency of the high frequency power applied to the upper electrode and the lower electrode, e.g., by applying a high frequency power of 60 MHz to the upper electrode and a high frequency power of 2 MHz to the lower electrode, making it possible to form a plasma of a higher density while maintaining a radical dissociation controllability substantially equal to that of the conventional capacitance coupling type parallel plate plasma processing apparatus and, to cope with the further miniaturization.

However, it has also been found that, if the frequency of the high frequency power applied to the upper electrode is increased, a new problem is generated that the etching uniformity is rendered poor. To be more specific, as shown by a broken line in FIG. 1A, the plasma sheath on the side of an upper electrode is rendered very thin in the central portion of the electrode, and the plasma sheath of a lower electrode is rendered thick in the central portion of the electrode. It follows that the plasma is rendered nonuniform in a direction parallel to the electrodes.

The difficulty is caused by the phenomenon that higher harmonic waves, which are absolutely generated when a high frequency power is applied, form a standing wave within the plane of the upper electrode. Since the standing wave has a large amplitude in the center of the upper electrode, the standing wave contributes to the plasma generated in the vicinity of the upper electrode, with the result that the sheath in the central portion of the upper electrode is rendered thinner than in the edge portions (peripheral portion). However, where the frequency of the power applied to the upper electrode is relatively low as in the conventional apparatus, e.g., where the frequency is lower than 50 MHz, the plasma density is not high and, thus, the plasma sheath is thick. It follows that the uniformity of the plasma is not greatly affected by the standing wave. Also, where the frequency is lower than 50 MHz, the wavelength of the higher harmonic wave is large compared with the diameter of the upper electrode, with the result that the influence given by the standing wave is diminished.

Figure 1A:
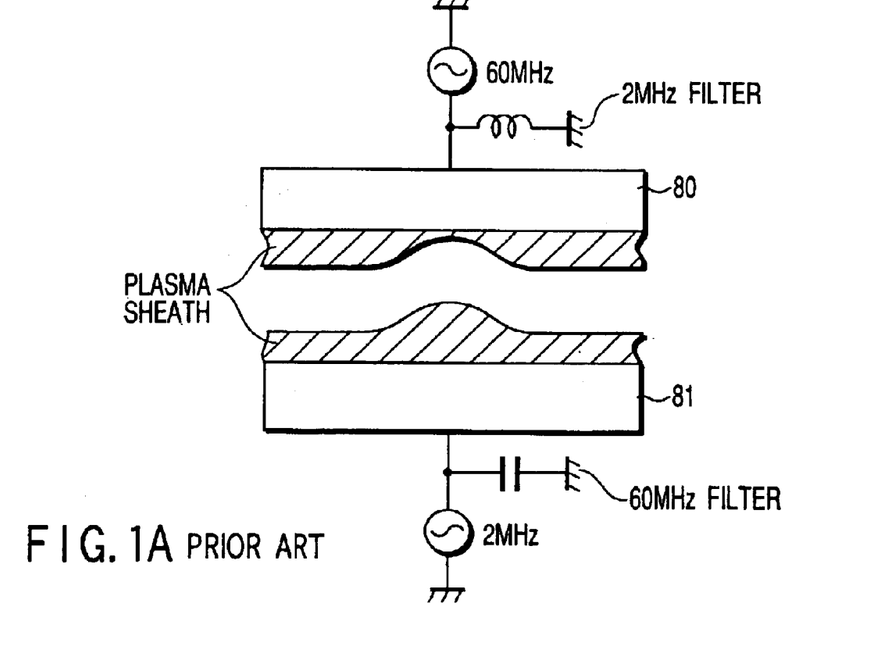
FIG. 1A is a view for explaining the principle of the prior art.

If the frequency of the high frequency power applied to the upper electrode is increased so as to increase the plasma density, the plasma sheath is rendered thin as a whole. Therefore, if the plasma sheath in the central portion of the upper electrode is affected by the standing wave, the plasma sheath is made markedly thin in the central portion of the electrode in the extreme case, as shown in the figure, leading to a poor uniformity of plasma.

On the other hand, it should be noted in conjunction with the plasma sheath of the lower electrode that, since the plasma sheath is thin in the central portion of the upper electrode, the capacitance in that portion is increased. As a result, an electric current flows in a concentrated fashion into the filter of 2 MHz so as to increase the thickness of the plasma sheath. It follows that the ions in the plasma in the central portion are further accelerated so as to make the etching rate in the central portion of the wafer higher than that in the peripheral portion of the wafer. As a result, the uniformity of the etching is lowered.

As a result of the continued research conducted in an attempt to overcome the new defect described above, the present inventors have found that it is possible to increase the thickness of the plasma sheath by applying a specified high frequency power in addition to the high frequency power described above to the upper and lower electrodes so as to diminish the fluctuation in the thickness of the plasma sheath. It has also been found that, in order to increase the thickness of the plasma sheath so as to diminish the fluctuation in the thickness of the plasma sheath, it is necessary to apply a high frequency power of a specified frequency to each of the upper and lower electrodes, the frequency of the high frequency power applied to the both electrodes being the same, in substantially the reverse phase or in the phase in the vicinity of the reverse phase.

It has also been found that, if a high frequency power of a specified frequency is applied to each of the upper and lower electrodes, the frequency of the high frequency power applied to the both electrodes being the same, in substantially the reverse phase or in the phase in the vicinity of the reverse phase, the shading damage is unlikely to take place.

According to a first aspect of the present invention, which has been achieved on the basis of the finding described above, there is provided a plasma etching apparatus, comprising:

a process chamber in which a target object to be processed is housed;

exhaust means for maintaining a predetermined reduced pressure within the process chamber;

gas introducing means for introducing an etching gas into the process chamber;

first and second electrodes arranged a predetermined distance apart from each other and to face each other within the process chamber, the target object being supported by the second electrode to face the first electrode;

first high frequency apply means for applying a high frequency power having a frequency of 50 MHz or higher to the first electrode so as to generate a plasma of the etching gas between the first electrode and the second electrode; and second high frequency apply means for applying a high frequency power to the second electrode;

the second high frequency apply means also applying a high frequency power to the first electrode so as to increase the thickness of the plasma sheath formed on the first electrode.

According to a second aspect of the present invention, there is provided a plasma etching apparatus, comprising:

a process chamber in which a target object to be etched is housed;

first and second electrodes arranged a predetermined distance apart from each other and in a manner to face each other within the process chamber;

first high frequency apply means for applying a first high frequency power having a frequency of 50 MHz or higher to the first electrode;

second high frequency apply means for applying a second and third high frequency powers to the first electrode and the second electrode respectively, the second and third high frequency powers having a frequency not lower than 2 MHz and not higher than that of the first high frequency power, the frequency of the second high frequency power being equal to that of the third high frequency power, and the second high frequency power having a reverse phase relative to the third high frequency power;

exhaust means for maintaining a predetermined reduced pressure within the process chamber; and gas introducing means for introducing an etching gas into the process chamber;

wherein a plasma of the etching gas is formed by allowing the high frequency powers to form a high frequency electric field between the first and second electrodes with the target object supported on the second electrode, thereby performing an etching treatment of the target object by the plasma, and the thickness of the plasma sheath formed on the first electrode is increased by the second high frequency power applied from the second high frequency apply means to the first electrode.

According to a third aspect of the present invention, there is provided a plasma etching apparatus, comprising:

a process chamber in which a target object to be processed is housed;

first and second electrodes arranged a predetermined distance apart from each other in a manner to face each other within the process chamber;

first high frequency apply means for applying a first high frequency power having a frequency not lower than 50 MHz to the first electrode;

second high frequency apply means for applying second and third high frequency powers to the first electrode and the second electrode respectively, the second and third high frequency powers having a frequency not lower than 2 MHz and not higher than that of the first high frequency power, the frequency of the second high frequency power being equal to that of the third high frequency power, and the second high frequency power having a phase difference of 180±45° relative to the third high frequency power;

exhaust means for maintaining a predetermined reduced pressure within the process chamber; and gas introducing means for introducing an etching gas into the process chamber;

wherein a plasma of the etching gas is formed by allowing the high frequency powers to form a high frequency electric field between the first and second electrodes with the target object supported on the second electrode, thereby performing an etching treatment of the target object by the plasma, and the thickness of the plasma sheath formed on the first electrode is increased by the second high frequency power applied from the second high frequency apply means to the first electrode.

Figure 1B:
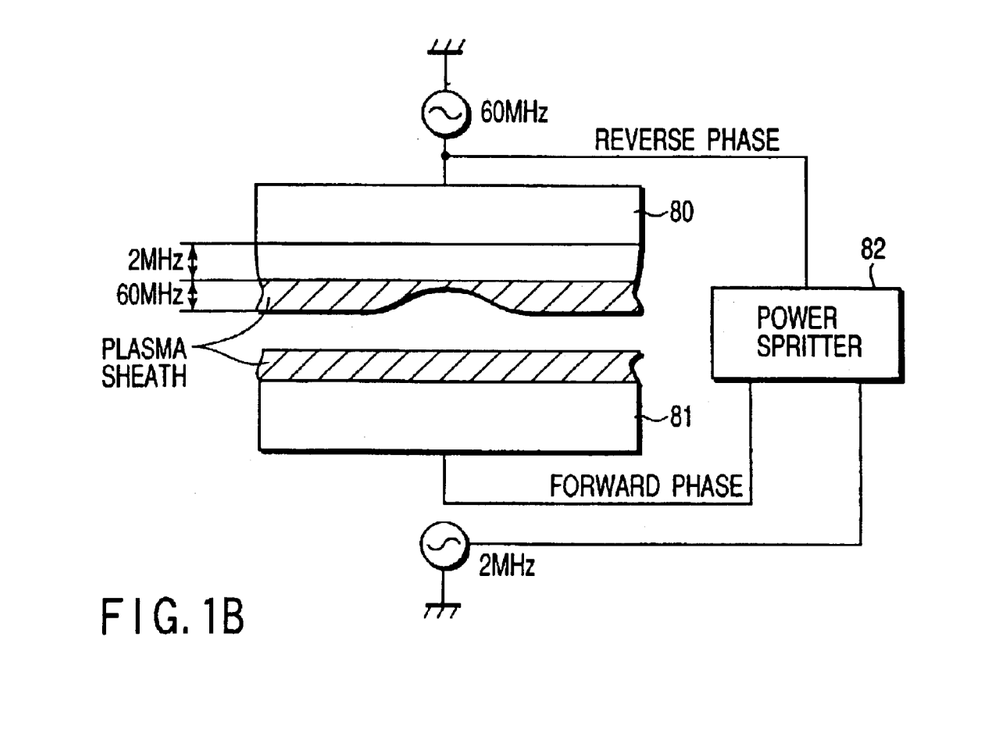
FIG. 1B is a view for explaining the principle of the present invention.

The plasma etching apparatus of the present invention comprises first high frequency apply means for applying a high frequency power having a frequency not lower than 50 MHz to the first electrode and second high frequency apply means for applying a high frequency power not only to the second electrode but also to the first electrode for increasing the thickness of the plasma sheath formed on the first electrode, with the result that, even if the plasma sheath is affected by the standing wave, the ratio in the change of the thickness of the plasma sheath is made relatively small so as to make the plasma more uniform. To be more specific, the second high frequency apply means applies second and third high frequency powers having a frequency not lower than 2 MHz and lower than the frequency of the first high frequency power to the first electrode and the second electrode, the frequency of the second high frequency power being equal to that of the third high frequency power, and the second high frequency power having a reverse phase relative to the third high frequency power. Thus, the second high frequency power having a relatively low frequency is applied from the second high frequency apply means to the first electrode in addition to the first high frequency power applied from the first high frequency apply means to the first electrode. It follows that, as shown in FIG. 1B, a plasma sheath corresponding to the low frequency, e.g., 2 MHz, of the second high frequency apply means is superposed on the plasma sheath of the frequency, e.g., 60 MHz, of the first high frequency apply means so as to form a thick plasma sheath on the first electrode. Also, the plasma sheath corresponding to 2 MHz is thicker than the plasma sheath corresponding to 60 MHz. It follows that, even if the plasma sheath is affected by the standing wave, the ratio in the change of the thickness of the plasma sheath is small so as to diminish the degree of reduction in the uniformity of the plasma. Also, since the thickness of the plasma sheath of the first electrode is increased, the change in the capacitance caused by the standing wave is small so as to make uniform the current flowing into the second electrode. As a result, the plasma sheath of the second electrode is made substantially uniform, as shown in the figure. It follows that, in the present invention, it is possible to cope with the miniaturization by a high density plasma and to ensure uniformity of the etching by a uniform plasma. Incidentally, FIG. 1B shows the state that high frequency powers of reverse phases having a frequency of 2 MHz are applied to the upper electrode (first electrode) and the lower electrode (second electrode) by using a power splitter used in the second high frequency apply means.

It should also be noted that, since the second and third high frequency powers applied from the second high frequency apply means to the first and second electrodes are substantially in reverse phases, the intensity of the electric field in the sheath portion is kept at a value higher than a predetermined value so as to make it possible to increase the space potential of plasma. In addition, the ionization rate is increased so as to increase the plasma density. As a result, the ions and electrons are allowed to have a high energy. Also, the ionization rate is increased in the vicinity of the electrode so as to increase the high speed electron flux. It follows that the electrons in the plasma are allowed to reach easily the bottom portion of the contact hole so as to neutralize the positive charge within the hole and, thus, to suppress the shading damage.

In the present invention, the prominent effects described above can be produced by applying second and third high frequency powers substantially forming reverse phases to the first and second electrodes. However, these high frequency powers need not form reverse phases for producing these effects as far as the phase difference is close to the reverse phase. To be more specific, desired effects can be obtained if the phase difference between the second and third high frequency powers falls within a range of 180±45°.

In the present invention, the first high frequency apply means applies a high frequency power having a frequency not lower than 50 MHz. If the frequency is lower than 50 MHz, it is difficult to obtain a desired high density plasma, resulting in failure to cope with the required miniaturization. Also, if the frequency is lower than 50 MHz, the problem itself to be solved by the present invention does not take place.

In the second aspect of the present invention, it is possible for the second high frequency apply means to comprise a high frequency power source having a frequency not lower than 2 MHz and lower than that of the first high frequency apply means and a transformer for distributing the power of the high frequency power source to the first and second electrodes.

In the second and third aspects of the present invention, the frequency of the second and third high frequency powers is not lower than 2 MHz. If the frequency is not lower than 2 MHz, the ions are unlikely to follow the high frequency power application, with the result that it is possible to suppress the damage done to the target object when the ions are drawn to the target object.

In each of the second aspect and the third aspect of the present invention, it is possible for the second high frequency apply means to comprise a high frequency oscillator having a frequency not lower than 2 MHz and lower than the frequency of the first high frequency apply means, amplifying means for amplifying the high frequency so as to apply a predetermined high frequency power to each of the first electrode and the second electrode, and a phase shift means for shifting the phase of the high frequency applied to the first electrode or the second electrode.

Also, in each of the second aspect and the third aspect of the present invention, it is desirable for the frequency of the second and third high frequency powers to fall within a range of between 2 MHz and 27 MHz. For example, it is desirable for the frequency of the first high frequency power to be about 60 MHz and for the frequency of the second and third high frequency powers to be about 2 MHz. Further, it is desirable for the ratio of the power supplied from the second high frequency apply means to the first electrode to the power supplied from the second high frequency apply means to the second electrode to fall within a range of between 6:4 and 4:6.

According to a fourth aspect of the present invention, there is provided a plasma etching apparatus, comprising:

a process chamber in which a target object to be etched is housed;

exhaust means for maintaining a desired reduced pressure state within the process chamber;

a gas introducing means for introducing an etching gas into the process chamber;

first and second electrodes arranged a predetermined distance apart from each other to face each other within the process chamber, the target object being supported on the second electrode to face the first electrode;

first high frequency apply means for applying a first high frequency power to the first electrode so as to cause the etching gas to form a plasma between the first electrode and the second electrode;

second high frequency apply means for applying a second high frequency power having a frequency lower than that of the first high frequency power to the second electrode;

third high frequency apply means for superposing a third high frequency power having a frequency lower than that of the first high frequency power and higher than that of the second high frequency power on the first high frequency power; and phase control means for adjusting the phase difference between the second high frequency power and the third high frequency power.

According to a fifth aspect of the present invention, there is provided a plasma etching method, comprising the steps of:

disposing a target object to be processed on a second electrode in a manner to face a first electrode with a predetermined space provided therebetween, the first and second electrodes being arranged within a process chamber having a reduced pressure;

introducing an etching gas into the process chamber;

applying a high frequency power having a frequency not lower than 50 MHz from a first high frequency apply means to the first electrode to cause the etching gas to generate a plasma between the first electrode and the second electrode; and applying a high frequency power from a second high frequency apply means to the second electrode;

the second high frequency apply means also applying a high frequency power to the first electrode so as to increase the thickness of the plasma sheath formed on the first electrode.

It may be apparent that the method according to the fifth aspect of the present invention produces effects similar to those produced by the invention according to the first aspect of the present invention.

Further, according to a sixth aspect of the present invention, there is provided a plasma etching method, comprising the steps of:

disposing a target object to be processed on a second electrode in a manner to face a first electrode with a predetermined space provided therebetween, the first and second electrodes being arranged within a process chamber having a reduced pressure;

introducing an etching gas into the process chamber;

applying a first high frequency power to the first electrode to cause the etching gas to generate a plasma between the first electrode and the second electrode;

applying a high frequency power having a frequency lower than that of the first high frequency power to the second electrode;

adjusting the phase of the frequency of at least one of the first high frequency power and the second high frequency power so as to provide a predetermined phase difference between the first and second high frequency powers; and applying a third high frequency power to the second electrode such that the third high frequency power is superposed on the first high frequency power.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

A first embodiment of the present invention will now be described with reference to the accompanying drawings.

Figure 2:
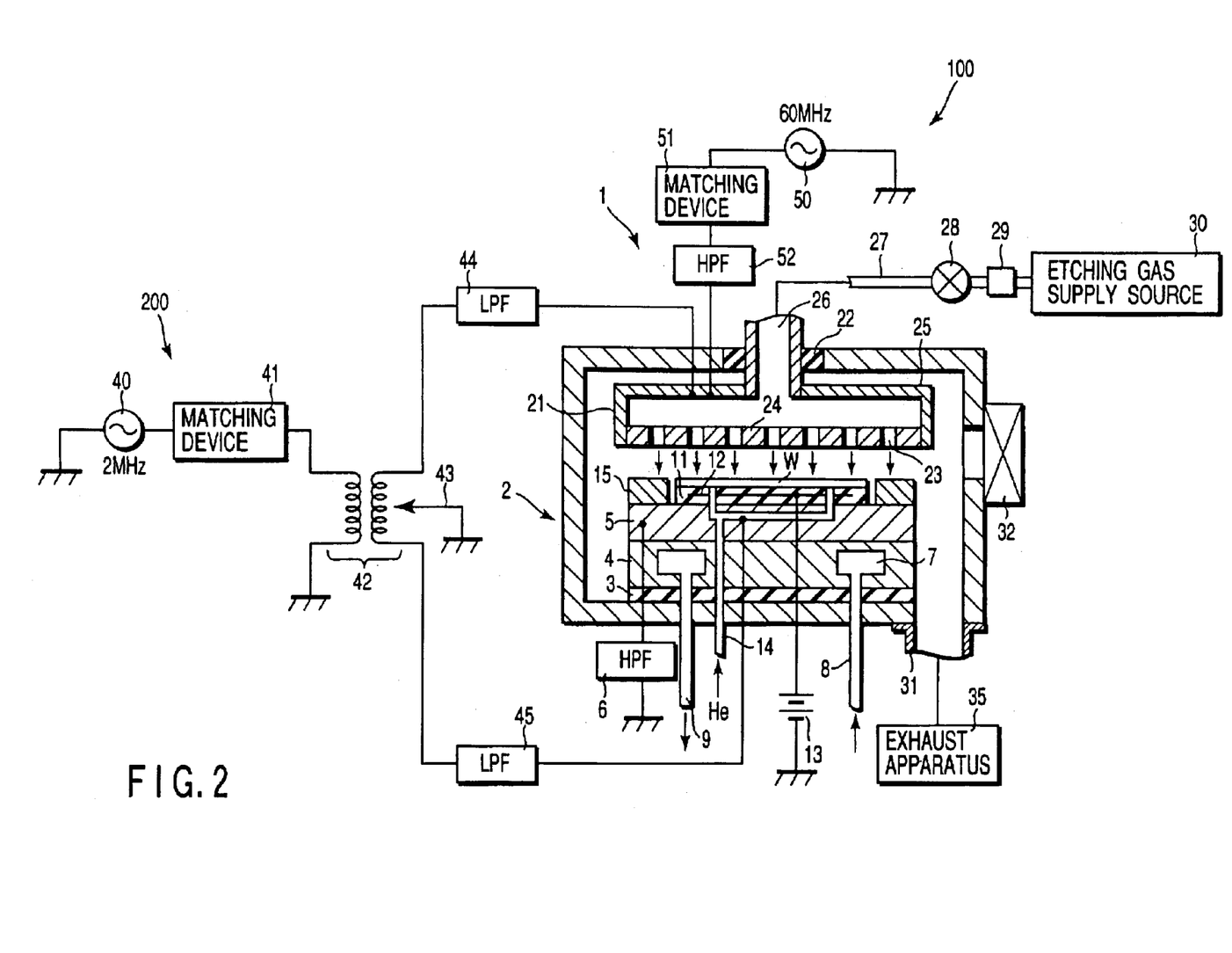
FIG. 2 is a cross sectional view schematically showing an etching apparatus according to a first embodiment of the present invention.

Specifically, FIG. 2 is a cross sectional view schematically showing an etching apparatus 1 according to the first embodiment of the present invention. The etching apparatus 1 is constructed as a capacitance coupling type parallel plate etching apparatus in which upper and lower electrode are arranged in parallel and a power source for plasma formation is connected to one of these upper and lower electrodes.

To be more specific, the etching apparatus 1 comprises a cylindrical chamber 2 made of aluminum and having, for example, an anodized aluminum treatment (anodic oxidation treatment) applied to the inner surface. The chamber 2 is connected to the ground for safety. A substantially columnar susceptor table 4 for supporting a target object to be processed, e.g., a semiconductor wafer (hereinafter referred to as a wafer) W, is arranged in the bottom portion of the chamber 2 with an insulating plate 3 made of, for example, a ceramic material, interposed therebetween. A susceptor 5 constituting a lower electrode (plate like electrode) is arranged on the susceptor table 4. The susceptor 5 is connected to the ground through a high pass filter (HPF) 6.

A cooling chamber 7 is formed within the susceptor table 4. A coolant such as a liquid nitrogen is introduced into the cooling chamber 7 through a coolant introducing pipe 8 and discharged from within the cooling chamber 7 through a coolant discharge pipe 9, so as to be circulated within the cooling chamber 7. During circulation of the coolant within the coolant chamber 7, the wafer W disposed on the susceptor 5 is cooled by the coolant via the susceptor table 4 and the susceptor 5 arranged on the susceptor table 4 so as to control the process surface of the wafer W at a desired temperature.

The susceptor 5 is in the shape of a disc, and an electrostatic chuck 11 substantially equal in shape to the wafer W is formed on the disc-like susceptor 5. The electrostatic chuck 11 is constructed such that an electrode 12 is interposed between insulating materials. A DC voltage of, for example, 1.5 kV is applied from a DC power source 13 to the electrode 12, with the result that the wafer W is electrostatically sucked on the electrostatic chuck by the Coulomb force or the Johnson-Rahbeck force.

A gas passageway 14 for supplying a heat transfer medium, e.g., a He gas, to the back surface of the wafer w is formed to extend through the insulating plate 3, the susceptor table 4, the susceptor 5 and the electrostatic chuck 11. The low temperature of the susceptor 5 is effectively transferred by the heat transfer medium to the wafer W so as to maintain the wafer W at a predetermined temperature.

An annular focus ring 15 is arranged on the upper peripheral portion of the susceptor 5 in a manner to surround the wafer W. The annular focus ring 15, which is made of a conductive material such as silicon, serves to improve the uniformity of the etching.

An upper electrode (plate like electrode) 21 is arranged above the lower electrode 5 in parallel to the susceptor 5 and in a manner to face the lower electrode 5 with a predetermined clearance provided therebetween. The upper electrode 21 is supported in an upper portion of the chamber 2 with an insulating material 22 interposed therebetween so as to constitute a surface facing the susceptor 5, and includes an electrode plate 24 having a large number of spurting holes 23 and an electrode support member 25 supporting the electrode plate 24. The electrode plate 24 is formed of, for example, silicon or an amorphous carbon. On the other hand, the electrode support member 25 is made of a conductive material such as an aluminum plate having the surface subjected to an anodized aluminum treatment. Incidentally, the lower electrode 5 and the upper electrode 21 are positioned about 10 to 60 mm apart from each other.

A gas introducing port 26 is formed in the center of the electrode support member 25 of the upper electrode 21. A gas supply pipe 27 is connected to the gas introducing port 26, and an etching gas supply source 30 is connected to the gas supply pipe 27 via a valve 28 and a mass flow controller 29. A process gas or etching gas for the etching treatment is supplied from the etching gas supply source 30. The process gas supplied from the etching gas supply source 30 includes, for example, a $CF_4$ gas.

A discharge pipe 31 is connected to the bottom portion of the chamber 2. An exhaust apparatus 35 is connected to the exhaust pipe 31. The exhaust apparatus 35 is equipped with a vacuum pump such as a turbo molecular pump so as to evacuate the chamber 2 to a reduced pressure of, for example about 1 mTorr (0.133 Pa). Also, a gate valve 32 is mounted to the side wall of the chamber 2. The wafer W is transferred between the chamber 2 and an adjacent load lock chamber (not shown) with the gate valve 32 kept open.

The mechanism of forming a plasma will now be described.

The apparatus of the first embodiment shown in FIG. 2 comprises a first high frequency apply mechanism 100 for applying a high frequency power having a relatively high frequency to the upper electrode 21 and a second high frequency apply mechanism 200 for applying high frequency powers having relatively low frequencies of substantially reverse phases to the susceptor 5 acting as the lower electrode and to the upper electrode 21. The second high frequency apply mechanism 200 is constructed to apply high frequency powers of the same frequency to the susceptor 5 and to the upper electrode 21.

The first high frequency apply mechanism 100 comprises a first high frequency power source 50, which is connected to the upper electrode 21 via a matching device 51 and a high pass filter (HPF) 52. The first high frequency power source 50 has a frequency not lower than 50 MHz, preferably between 60 MHz and 200 MHz. A high density plasma is formed within the chamber 2 under a low pressure condition by applying a high frequency power having such a high frequency to the upper electrode 21. It is more desirable for the first high frequency power source 50 to have a frequency of 60 MHz and an output power of 2,000W.

The second high frequency power source 200 comprises a second high frequency power source 40, which is connected to the primary side of a transformer 42 constituting a power splitter via a matching device 41. A ground terminal 43 is connected to the secondary side of the transformer 42. The secondary side of the transformer 42 is connected to the lower electrode 5 via a low pass filter (LPF) 45 and is also connected to the upper electrode 21 via a low pass filter (LPF) 44. It follows that the power of the high frequency power source 40 can be distributed with an optional ratio by selecting the opposition of the ground terminal 43. For example, where the output power of the high frequency power source 40 is 1,000W, it is possible to distribute 600W to the lower electrode 5 and 400W to the upper electrode 21. Also, high frequency powers substantially forming reverse phases, i.e., differing from each other in phase by 180°, are applied to the lower and upper electrodes 5, 21. The second high frequency power source 40 has a frequency lower than that of the first high frequency power source 50. Specifically, the second high frequency power source 40 has a frequency of, preferably 800 kHz to 28 MHz, more preferably 2 MHz to 13.56 MHz. If the second high frequency power source 40 has a frequency exemplified above, it is possible to suppress the damage done to the wafer W by the ions drawn to the lower electrode 5. It is substantially desirable for the second high frequency power source 40 to have a frequency of 2 MHz. As described herein later, it has been experimentally confirmed that, in order to effectively prevent the shading damage, it is desirable for the distribution ratio between the upper electrode 21 and the lower electrode 5 to fall within a range of between 4:6 and 6:4.

Where a silicon oxide film ($SiO_2$ film) formed on a silicon wafer (target object) W is etched by the etching apparatus 1 of the construction described above, the gate valve 32 is opened first and, then, the wafer W is introduced from a load lock chamber (not shown) into the chamber 2 so as to be disposed on the electrostatic chuck 11. Then, a DC voltage is applied from the high DC power source 13 so as to permit the wafer W to be electrostatically sucked on the electrostatic chuck 11. Then, the gate valve 32 is closed, and the pressure within the chamber 2 is reduced by the exhaust mechanism 35 to a predetermined degree of vacuum.

In the next step, the valve 28 is opened so as to permit, for example, a $CF_4$ gas to be supplied from the etching gas supply source 30 to the hollow portion of the upper electrode 21 through the process gas supply pipe 27 and the gas introducing port 26 while the flow rate of the $CF_4$ gas is being controlled by the mass flow controller 29. Further, the $CF_4$ passes through the spurting ports 23 of the electrode plate 24 so as to be discharged uniformly toward the wafer W, as denoted by arrows in FIG. 2.

In the state that the pressure within the chamber 2 is maintained at, for example, 20 mTorr (2.66 Pa), a high frequency of, for example, 60 MHz is applied from the high frequency power source 50 of in the first high frequency apply mechanism 100 to the upper electrode 21. As a result, a high frequency electric field is formed between the upper electrode 21 and the lower electrode 5 so as to dissociate the process gas to form a plasma. On the other hand, high frequency powers of 2 MHz in substantially reverse phases (differing from each other in phase by 180°) are supplied from the high frequency power source 40 included in the second high frequency apply mechanism 200 to the susceptor 5 and to the upper electrode 21 through the transformer 42.

The component applied from the second high frequency apply mechanism 200 to the upper electrode 21 performs the function of increasing the thickness of the plasma sheath formed on the side of the upper electrode 21 by the high frequency of, for example, 60 MHz supplied from the first high frequency apply mechanism 100 to the upper electrode. As a result, the nonuniformity in the thickness of the plasma sheath formed on the surface of the upper electrode 21 by the higher harmonic wave forming the standing wave is moderated so as to form a uniform plasma.

On the other hand, the component applied from the second high frequency apply mechanism 200 to the lower electrode susceptor 5 performs the function of positively drawing mainly the ions in the gaseous molecules converted into a plasma toward the susceptor 5. By this ion assist, an etching having a higher anisotropy can be applied to the oxide film of the wafer W mounted on the susceptor 5. In this case, since the frequency is not lower than 2 MHz, a damage is unlikely to be done to the wafer W.

As described above, a high density plasma can be formed under a low pressure by applying a high frequency power having a relatively high frequency not lower than 50 MHz, e.g., 60 MHz. In addition, since the etching selectivity and anisotropy can be enhanced by applying a high frequency power having a lower frequency, e.g., 2 MHz, to the lower electrode 5, it is possible to apply a fine processing to the wafer W. Further, since it is possible to eliminate the nonuniformity of plasma that takes place in the case of applying a high frequency power having a relatively high frequency, e.g., 60 MHz, to the upper electrode 21, it is possible to ensure the uniformity of the plasma processing.

As described previously, high frequency powers of 2 MHz in substantially reverse phases are applied from the second high frequency apply mechanism 200 to both the lower and upper electrodes 5, 21 so as to diminish the fluctuation in the sheath thickness. As a result, the intensity of the electric field in the sheath portion bears a value higher than a predetermined value so as to increase the space potential of the plasma. It follows that the ionization rate is increased so as to increase the plasma density and, thus, the ions and the electrons are allowed to have a high energy. It is also possible to increase the ionization rate in the vicinity of the electrode so as to increase the high speed electron flux. It follows that the electrons within the plasma are allowed to reach easily the bottom portion of the contact hole so as to neutralize the positive charge within the hole, thereby suppressing the shading damage.

It should also be noted that, since the low pass filter (LPF) 44 is interposed between the secondary side of the transformer 42 and the upper electrode 21 and the low pass filter (LPF) 45 is interposed between the secondary side of the transformer 42 and the lower electrode 5, it is impossible for the high frequency power of, for example, 60 MHz supplied from the first high frequency source 50 to enter the routes including the low pass filters (LPF) 44 and 45. Also, since the high pass filter (HPF) 52 is included in the route of supplying the high frequency power of the first high frequency power source 50, it is impossible for the high frequency power having a low frequency of, for example, 2 MHz supplied from the second high frequency power source 40 to enter the route of supplying the high frequency power of the first high frequency power source 50. It follows that it is possible to realize a stable process. Incidentally, in view of such a blocking function, it is possible to use another blocking means in place of the low pass filters (LPF) 44, 45 and the high pass filter (HPF) 52.

The result of the simulation of the plasma formed by the plasma processing apparatus of the present invention will now be described.

Figure 3:
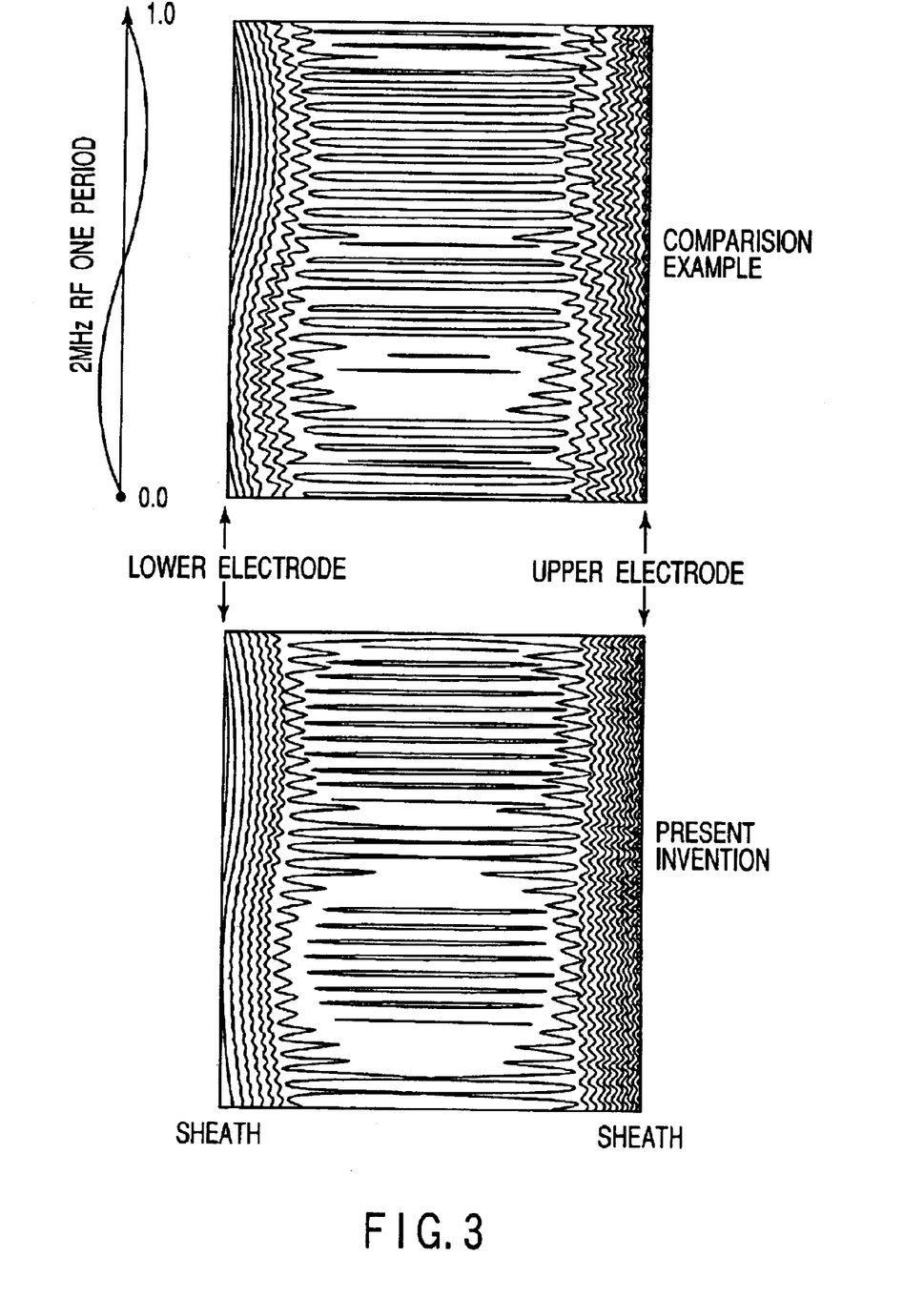
FIG. 3 is a view showing the result of simulation in respect of the potential distribution of plasma.
Figure 4:
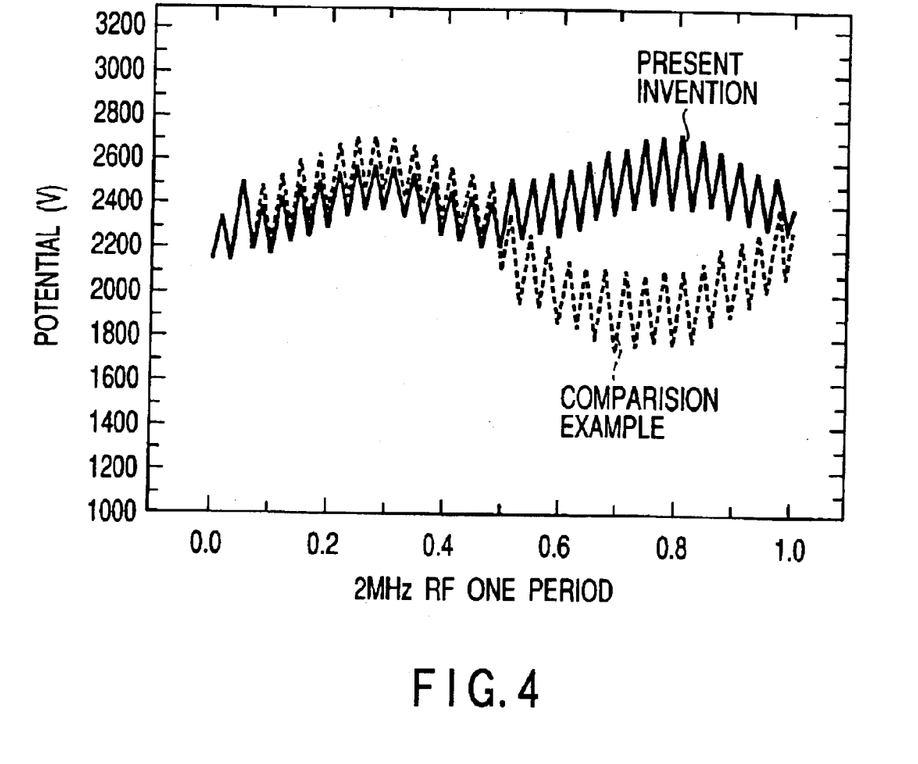
FIG. 4 is a graph showing the space potential of plasma.
Figure 5A:
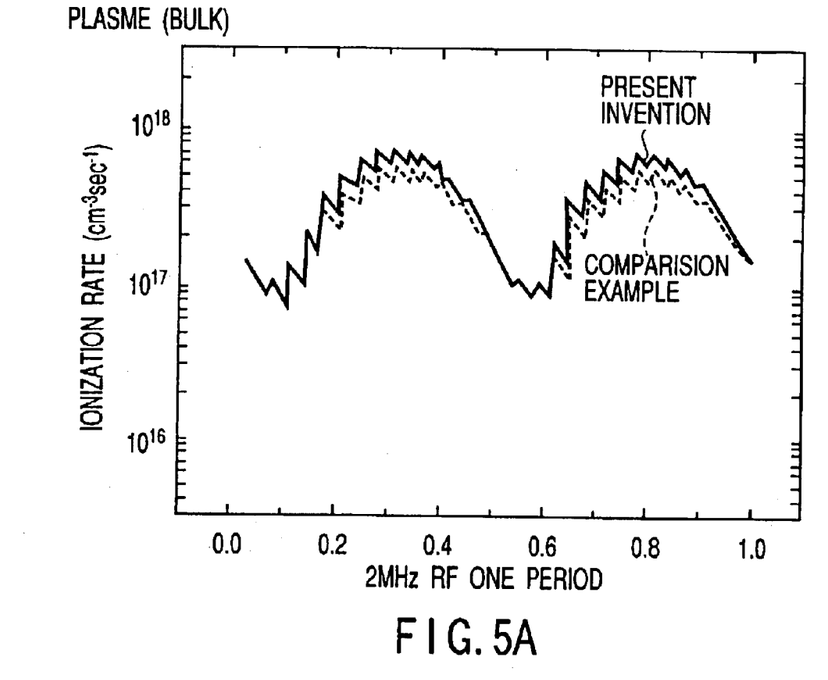
FIGS. 5A and 5B are graphs showing the ionization rates of the plasma in the vicinity of the electrode and the bulk.
Figure 5B:
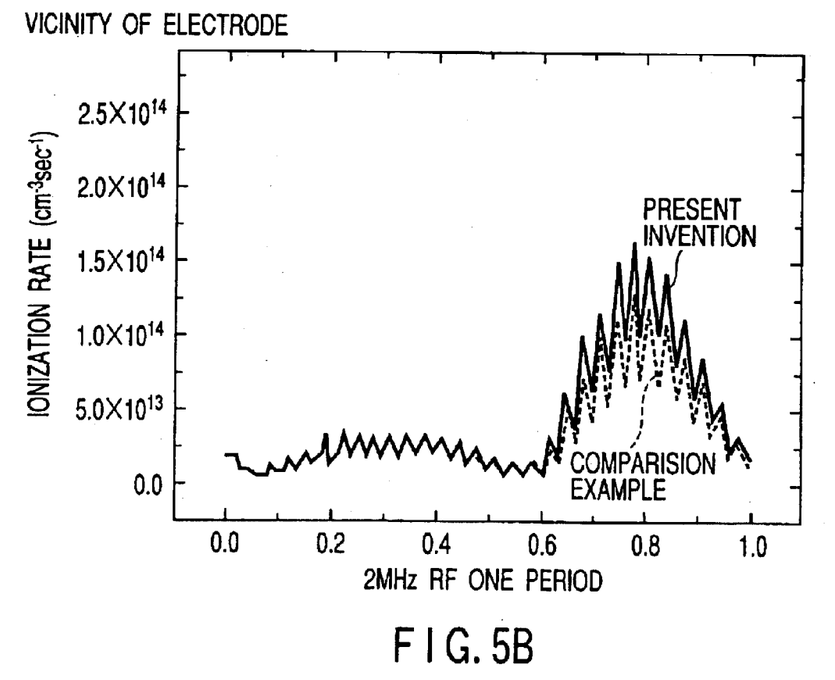

FIG. 3 shows graphs showing the potential distribution within the space above the center of the wafer, covering the cases where a high frequency power of 60 MHz was applied to the upper electrode and a high frequency power of 2 MHz was applied to both the upper electrode and the lower electrode with a distribution ratio of 4:6 as in the present invention, and where a high frequency power of 60 MHz was applied to the upper electrode and a high frequency power of 2 MHz was applied to the lower electrode alone as in the comparison example. In each of the graphs shown in FIG. 3, the distance in a direction perpendicular to the plane of the electrode is plotted on the abscissa, and the time covering one period of the high frequency power of 2 MHz is plotted on the ordinate. As shown in the graphs, the sheath thickness is stable in the present invention, compared with the comparison example. It is seen that the intensity of the electric field, which is denoted by the gradient of the potential in the sheath portion, has a value higher than a certain value. It should also be noted that the plasma potential for the present invention is higher than that for the comparison example as shown in FIG. 4, and the fluctuation in the plasma potential in the present invention is smaller than that in the comparison example. Further, the ionization rate in the present invention is higher than that in the comparison example in each of the bulk (plasma itself) and in the vicinity of the electrode, as shown in FIGS. 5A and 5B. In other words, the plasma density for the present invention is higher than that for the comparison example. It has also been confirmed by the simulation that the ions and the electrons are allowed to have a higher energy so as to increase the high speed electron flux. Further, the time for electrons within the plasma sheath to be migrated to reach the wafer was examined by means of simulation. It has been found that the electron migrating time for the comparison example was 3.3 nsec in contrast to 3.2 nsec for the present invention. In other words, electrons are migrated in a higher speed in the present invention. It follows that the number of electrons reaching the bottom portion 103 of the contact hole 101 shown in FIG. 8 is increased in the present invention so as to moderate the positive charge in the bottom portion 103 and, thus, to suppress the shading damage.

As described above, it has been confirmed that the thickness of the plasma sheath is unlikely to be fluctuated in the present invention so as to suppress the shading damage.

An accelerating experiment of the shading damage was actually conducted. It has been found that the yield was 59% for the comparison example in contrast to 98% for the present invention. Also, it has been confirmed that the shading damage can be prevented particularly effectively in the case where the distribution ratio of the high frequency power to the upper electrode and to the lower electrode falls within a range of between 4:6 and 6:4. It has also been confirmed that, where the distribution ratio of the high frequency power to the upper electrode and to the lower electrode is set at 6:4, the etching selectivity ratio was higher than that in the comparison example and that in the case where the distribution ratio was set at 4:6. It is considered reasonable to understand that, in the case of increasing the power applied to the upper electrode, the radical distribution is increased in the vicinity of the wafer so as to lead to the high etching selectivity ratio noted above.

Figure 6:
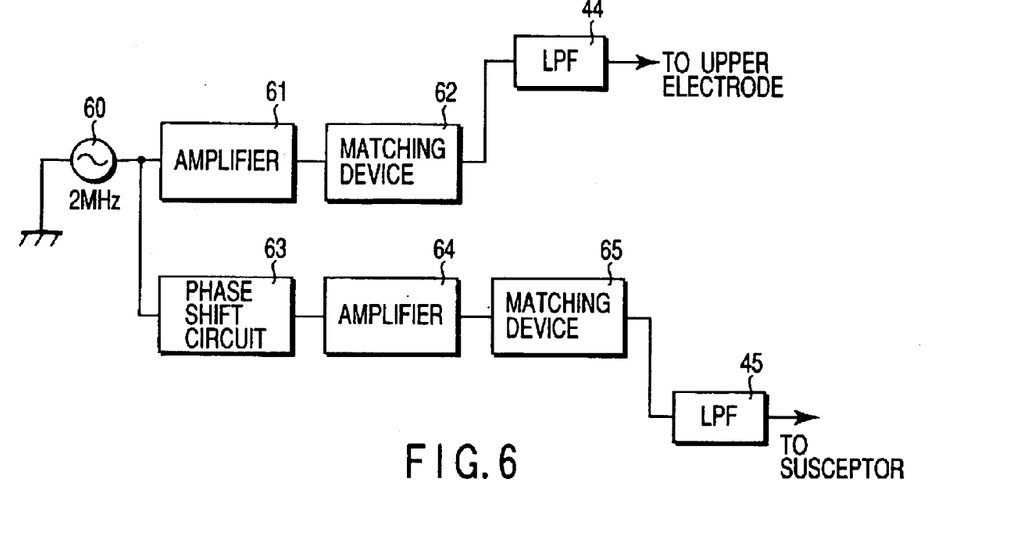
FIG. 6 is a view showing another example of a second high frequency power apply mechanism.

The present invention is not limited to the embodiment described above, making it possible to modify the embodiment described above in various fashions. For example, in the embodiment described above, a so-called power splitter was used in the second high frequency apply mechanism 200. However, the second high frequency apply mechanism 200 does not include to a power splitter, as far as high frequency powers of reverse phases can be applied to the upper and lower electrodes. For example, it is possible to employ the circuit shown in FIG. 6. Specifically, a high frequency oscillator 60 oscillating a high frequency power of, for example, 2 MHz is connected to the upper electrode 21 through an amplifier 61, a matching device 62 and the low pass filter (LPF) 44 and is also connected to the susceptor or lower electrode 5 through a phase shift circuit 63, an amplifier 64, a matching device 65 and the low pass filter (LPF) 45. The phase of the high frequency power applied to the susceptor 5 is shifted by 180° by the phase shift circuit 63 so as to form a reverse phase. If the frequency is increased, the transformer fails to perform its function. Therefore, the construction shown in FIG. 6 is particularly effective under a high frequency.

In the embodiment described above, high frequency powers having reverse phases are applied to the upper electrode and the lower electrode. However, it is not absolutely necessary for the high frequency powers to have reverse phases, as far as the phases of these high frequency powers are close to the reverse phases. To be more specific, a desired effect can be obtained if the phase shift falls within the range of 180±45°. The particular construction can be achieved by adjusting the shift amount of the phase shift circuit 63 shown in FIG. 6.

Figure 7:
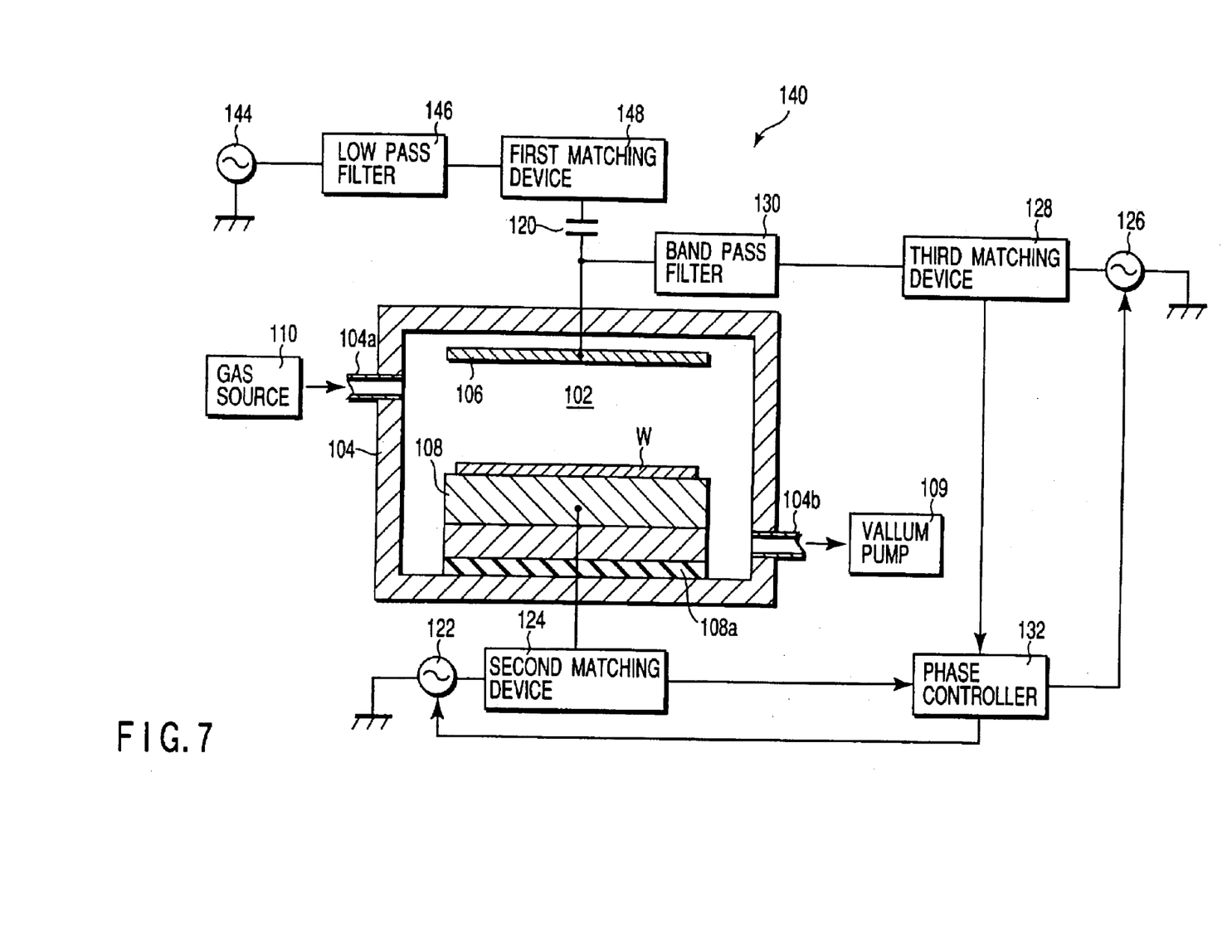
FIG. 7 is a view for schematically showing an etching apparatus according to a second embodiment of the present invention.

A plasma etching apparatus 140 according to the second embodiment of the present invention will now be described with reference to FIG. 7.

Specifically, the plasma etching apparatus 140 comprises a conductive and hermetic process vessel 104 connected to the ground. A process chamber 102 is defined within the process vessel 104. An upper electrode plate (first electrode) 106 and a lower electrode plate (second electrode) 108 are arranged to face each other within the process chamber 102. These first and second electrodes 106 and 108 are arranged a predetermined distance apart from each other. The lower electrode plate 108 is fixed to the lower wall of the process vessel with an insulator 108a interposed therebetween, and performs the function of a susceptor on the upper surface of which is disposed a target object to be processed, e.g., a semiconductor wafer having an SiO$_2$ film formed thereon. It is possible for the second electrode 108 to be constructed as shown in FIG. 2. An inlet port 104a connected to an etching gas source 110 is formed in an upper portion of the circumferential wall of the process vessel 104. On the other hand, an outlet port 104b connected to a vacuum pump 109 is formed in a lower portion of the circumferential wall of the process vessel 104. As a result, during the etching treatment, an etching gas is supplied into the process chamber 102 through the inlet port 104a and, at the same time, the process chamber is exhausted by the vacuum pump 109 so as to maintain a predetermined reduced pressure within the process chamber 102.

It is possible for the first electrode 106 and the inlet port 104a to be constructed to form a shower head as shown in FIG. 2.

A first high frequency power source 144 is connected to the upper electrode plate 106 via a low pass filter 146, a first matching device 148, and a capacitor 120. As a result, a first high frequency power of 5 kW having a predetermined frequency, e.g., 50 to 200 MHz, preferably about 60 MHz, is supplied to the upper electrode plate 106. It should be noted that the capacitor 120 passes the first high frequency power and serves to prevent a third high frequency power, which is to be described herein later, from entering the first matching device 148.

A second high frequency power source 122 is connected to the lower electrode plate 108 via a second matching device 124. As a result, a second high frequency power of 5 kW having a predetermined frequency, e.g., 800 kHz to 28 MHz, preferably about 2 MHz, is supplied to the lower electrode plate 108.

Further, a third high frequency power source 126 is connected to the wiring between the upper electrode plate 106 and the capacitor 120 via a third matching device 128 and a band pass filter 130. Therefore, a third high frequency power having a frequency lower than that of the first high frequency power and not lower than that of the second high frequency power is applied to the upper electrode plate 106 in a manner to. superpose on the first high frequency power. In this preferred embodiment, the third high frequency power 126 is set at 2 kW with a frequency of about 2 MHz. The band pass filter 130 passes the third high frequency power (2 MHz) and, at the same time, serves to prevent the first high frequency power (60 MHz) from entering the third matching device 128. It follows that the band pass filter 130 and the capacitor 120 serve to prevent the undesired high frequency power from entering the first and third matching devices 148, 128, thereby preventing malfunctions of the matching devices.

The output side of a phase controller 132 is connected to each of the second high frequency power source 122 and the third high frequency power source 126. The input side of the phase controller 132 is connected to the second matching device 124 and to the third matching device 128. As a result, the second and third power sources 122, 126 are controlled on the basis of the phase of the second high frequency power source and the phase of the third high frequency power source detected by the matching devices 124 and 128, respectively, so as to permit the phase of the second high frequency power source 122 and the phase of the third high frequency power source 126 to have a predetermined phase difference.

The etching treatment using the etching apparatus 140 of the construction described above will now be described.

In the first step, the target object (wafer) W is disposed on the lower electrode 108, followed by supplying an etching gas into the process chamber 102. At the same time, the process chamber 102 is evacuated to a predetermined pressure, e.g., 20 mTorr, and the reduced pressure is maintained. Under this condition, the first high frequency power is applied from the first high frequency power source 144 to the upper electrode plate 106 so as to generate a plasma of the etching gas between the two electrode plates 106, 108. At substantially the same time, the second high frequency power is applied from the second high frequency power source 122 to the lower electrode plate 108. Also, the third high frequency power is superposed on the first high frequency power by the third high frequency power source 126 and applied to the upper electrode 106 by detecting the phases of the first and second high frequency powers so as to provide a predetermined phase difference, thereby making the plasma density uniform. Under this condition, the etching of the target object proceeds.

A uniform etching treatment can be applied to the $SiO_2$ film formed on the wafer W with a high etching rate by the plasma of the uniform density thus generated. Also, since the plasma conforms uniformly with the wafer W, it is possible to prevent a damage done to the target object by the nonuniformity of the plasma.

In the embodiment described above, a semiconductor wafer W is used as the target object to be processed. However, it is also possible to apply the etching treatment to other substrates such as a glass plate for a liquid crystal display (LCD) device.

As described above, each of the etching apparatus according to the first to third aspects and the fifth aspect of the present invention comprises first high frequency apply means for applying a high frequency power of 50 MHz or higher to the first electrode and second high frequency apply means for applying a high frequency power to the second electrode. It should be noted that the second high frequency apply means also applies the high frequency power to the first electrode in order to increase the thickness of the plasma sheath formed on the first electrode. Therefore, even if the plasma sheath is affected by the standing wave, the ratio in the change in the thickness of the plasma sheath is rendered relatively small so as to make the plasma more uniform. To be more specific, since the etching apparatus of the present invention comprises the first high frequency apply means for applying a high frequency power of 50 MHz or higher to the first electrode and the second high frequency apply means for applying a high frequency power having a frequency not lower than 2 MHz and lower than the frequency of the high frequency power applied by the first high frequency apply means to each of the first electrode and the second electrode, the frequency of the high frequency power applied by said second high frequency apply means to the first electrode being equal to that of the high frequency power applied by the second high frequency apply means to the second electrode, and the high frequency power applied by said second high frequency apply means to the first electrode substantially forming a reverse phase relative to the high frequency power applied by the second high frequency apply means to the second electrode, a high frequency power having a relatively low frequency is applied from the second high frequency apply means to the first electrode as well as the high frequency power applied from the first high frequency apply means to the first electrode. It follows that, in the plasma sheath of the upper electrode, the portion corresponding to the high frequency power of the second high frequency apply means having a lower frequency is superposed on the portion corresponding to the high frequency power of the first high frequency apply means. It follows that, even if the plasma sheath is affected by the standing wave, the uniformity of the plasma is scarcely made poor, and the plasma sheath of the lower electrode is made substantially uniform. Therefore, it is possible to cope with the miniaturization performed by a high density plasma, and it is also possible to ensure a uniformity of the plasma processing by a uniform plasma.

It should also be noted that, since the fluctuation in the thickness of the plasma sheath is diminished by the application of the high frequency powers to the first and second electrodes, the intensity of the electric field in the sheath portion is kept maintained at a value higher than a predetermined value. As a result, the space potential of the plasma can be increased, and the ionization rate can be increased so as to increase the plasma density. It follows that the ions and the electrons are allowed to have a high energy. It is also possible to increase the ionization rate in the vicinity of the electrode so as to increase the high speed electron flux. It follows that the electrons within the plasma are allowed to reach easily the bottom portion of the contact hole so as to neutralize the positive charge within the hole. AS a result, the shading damage is unlikely to take place.

As described above, the prominent effects described above can be produced by applying high frequency powers substantially forming reverse phases to the first and second electrodes. However, desired effects can also be obtained if the phase difference between the high frequency powers applied to the first and second electrodes falls within a range of 180±45°.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A plasma etching apparatus, comprising:

a process chamber in which a target object to be processed is housed;

exhaust means for maintaining a desired reduced pressure state within the process chamber;

gas introducing means for introducing an etching gas into the process chamber;

first and second electrodes arranged a predetermined distance apart from each other and to face each other within the process chamber, said target object being supported on said second electrode to face said first electrode;

first high frequency apply means for applying a first high frequency power to the first electrode so as to cause said etching gas to form a plasma between the first electrode and the second electrode;

second high frequency apply means for applying a second high frequency power having a frequency lower than that of the first high frequency power to the second electrode;

third high frequency apply means for superposing a third high frequency power having a frequency lower than that of the first high frequency power and higher than that of the second high frequency power on the first high frequency power; and phase control means for adjusting the phase difference between the second high frequency power and the third high frequency power.

2. The plasma etching apparatus according to claim 1, wherein the frequency of said third high frequency power is set equal to that of said second high frequency power.

3. The plasma etching apparatus according to claim 1, wherein said first high frequency apply means comprises a first high frequency power source, a first matching device connected between said first high frequency power source and said first electrode, and a capacitor connected between said first matching device and the first electrode with a wiring interposed therebetween, and wherein said second high frequency apply means comprises a second high frequency power source, and a second matching device connected between said second high frequency power source and said second electrode, and wherein said third high frequency apply means comprises a third high frequency power source, a third matching device connected between said third high frequency power source and said wiring, and a band pass filter connected between said third matching device and said wiring.

4. The plasma etching apparatus according to claim 3, wherein said phase control means comprises a phase controller having an input side connected to said second and third matching devices and having an output side connected to said second and third high frequency power sources, said phase controller serving to control the phase of the high frequency power generated from at least one of the second and third high frequency power sources so as to adjust the phase difference between the high frequency powers generated from the second and third high frequency power sources in a manner to form a uniform plasma.

* * * * *